United States Patent
Wang et al.

(10) Patent No.: US 9,810,988 B2
(45) Date of Patent: Nov. 7, 2017

(54) COMPOSITION FOR FORMING OVERLAY FILM, AND RESIST PATTERN FORMATION METHOD EMPLOYING THE SAME

(71) Applicant: AZ ELECTRONIC MATERIALS (LUXEMBOURG) S.A.R.L., Somerville, NJ (US)

(72) Inventors: Xiaowei Wang, Shizuoka (JP); Masato Suzuki, Shizuoka (JP); Tetsuo Okayasu, Shizuoka (JP); Georg Pawlowski, Shizuoka (JP)

(73) Assignee: AZ Electronic Material (Luxembourg) S.àr.l., Luxembourg (LU)

( * ) Notice: Subject to any disclaimer, the term of this patent is extended or adjusted under 35 U.S.C. 154(b) by 0 days.

(21) Appl. No.: 14/652,667

(22) PCT Filed: Dec. 12, 2013

(86) PCT No.: PCT/JP2013/083319
§ 371 (c)(1),
(2) Date: Jun. 16, 2015

(87) PCT Pub. No.: WO2014/092149
PCT Pub. Date: Jun. 19, 2014

(65) Prior Publication Data
US 2015/0331323 A1    Nov. 19, 2015

(30) Foreign Application Priority Data

Dec. 13, 2012 (JP) .................................. 2012-272516

(51) Int. Cl.
| | | |
|---|---|---|
| *G03F 7/20* | (2006.01) |
| *G03F 7/11* | (2006.01) |
| *C09D 1/00* | (2006.01) |
| *C09D 125/06* | (2006.01) |
| *C09D 129/04* | (2006.01) |
| *C09D 133/02* | (2006.01) |
| *C09D 165/00* | (2006.01) |
| *G03F 7/09* | (2006.01) |

(52) U.S. Cl.
CPC ............ *G03F 7/2002* (2013.01); *C09D 1/00* (2013.01); *C09D 125/06* (2013.01); *C09D 129/04* (2013.01); *C09D 133/02* (2013.01); *C09D 165/00* (2013.01); *G03F 7/091* (2013.01); *G03F 7/11* (2013.01)

(58) Field of Classification Search
None
See application file for complete search history.

(56) References Cited

U.S. PATENT DOCUMENTS

| | | | |
|---|---|---|---|
| 2005/0008864 A1 | 1/2005 | Schenau et al. | |
| 2011/0003252 A1* | 1/2011 | Singh ..................... | G03F 7/039 430/296 |
| 2012/0021555 A1 | 1/2012 | Tu et al. | |
| 2012/0045900 A1* | 2/2012 | Watanabe ............ | C07C 69/753 438/703 |
| 2013/0209940 A1 | 8/2013 | Sakamoto et al. | |

FOREIGN PATENT DOCUMENTS

| | | | |
|---|---|---|---|
| JP | 2004-348133 A | | 12/2004 |
| JP | 2006-189612 A | | 7/2006 |
| JP | 2006-227389 A | * | 8/2006 |
| JP | 2006-227391 A | * | 8/2006 |
| JP | 2006-189612 A5 | | 11/2007 |
| JP | 2008-46206 A | | 2/2008 |
| WO | WO 2012-053302 A1 | | 4/2012 |

OTHER PUBLICATIONS

English translation of JP 2006-227389 A generated Oct. 2015, at INPIT website, 22 pages.*
English translation of JP 2006-227391 a generated May 29, 2017 from AIPN Japan Patent Office National Center for Industrial Property Information and Training, 38 pages.*

* cited by examiner

*Primary Examiner* — Cynthia Hamilton
(74) *Attorney, Agent, or Firm* — Mitchell Brustein

(57) ABSTRACT

The objective of this invention is to provide a composition for forming a topcoat layer enabling to produce a pattern excellent in roughness and in pattern shape; and also to provide a pattern formation method employing that composition is described. The means for solving this objective is a composition for forming a topcoat layer, comprising a solvent and a fullerene derivative having a hydrophilic group; and also a method of forming a pattern by casting the above composition on a resist surface and then by subjecting it to exposure and development.

15 Claims, No Drawings

COMPOSITION FOR FORMING OVERLAY FILM, AND RESIST PATTERN FORMATION METHOD EMPLOYING THE SAME

This application is a United States National Stage Patent Application under 35 U.S.C. §371 of International Patent Application No. PCT/JP2013/083319, filed Dec. 12, 2013, which claims priority to Japanese Patent Application No. 2012-272516, filed Dec. 13, 2012.

TECHNICAL FIELD

The present invention relates to a composition for forming a topcoat layer used in a photolithographic process. In detail, this invention relates to a composition for forming a topcoat layer that is provided on a resist layer before the resist layer is exposed to extreme UV light for producing a resist pattern in a photolithographic process. Further, the invention also relates to a pattern formation method using that composition for forming a topcoat layer.

BACKGROUND ART

According to a recent trend toward downsizing of various devices, there have been strong demands for high integration of semiconductor ICs and hence resist patterns have been required to be made more and more minute so as to meet the demands. In order to satisfy this requirement, it is necessary to adopt a photolithographic process including exposure to light in a shorter wavelength range. The light for exposure has become shorter and shorter in wavelength, and has changed from visible light to UV or far UV light. Further, the exposure is now often carried out by use of extreme UV light. For example, in manufacture of semiconductor devices such as ICs and LSIs, specifically, in production processes of DRAMs, flash memories and logic semiconductor devices, it is required to form ultrafine patterns and hence lithography with extreme UV light is becoming more and more important.

To cope with the above requirement, researchers have developed many resist compositions sensitive to light in various wavelength ranges. Among them, commercially available chemically amplified resist compositions have been hitherto thought to be mostly employable in a photolithographic process with extreme UV light. For example, common resist compositions for KrF or ArF laser exposure have been regarded as also usable in a lithographic process including exposure to extreme UV light. Actually, however, there remain many problems needed to improve in view of resolution, sensitivity, roughness, and so on.

On the other hand, there also remain problems of light sources and masks in exposure apparatuses, and those problems are reasons why lithography technique with extreme UV light has not yet been widely employed in practice. It has been thought that resist pattern shapes are impaired by longer wavelength light, particularly, deep UV light of, for example, 193 nm or 248 nm, contained in emission from extreme UV light sources. When resist compositions for KrF or ArF laser exposure are used as described above in a lithographic process with extreme UV light, they are sensitively made to react not only by extreme UV light but also, of course, by deep UV light in a longer wavelength range than extreme UV light.

Extreme UV light sources generally emit extreme UV light together with longer wavelength light, such as deep UV light. Accordingly, when a fine pattern is intended to be formed according to a lithographic process by use of extreme UV light, it is preferred to adopt a light source less emitting the longer wavelength light. In order to remove deep UV light from radiation emitted by exposure apparatuses, the way of generating extreme UV light is commonly controlled. For example, optical systems in the apparatuses are regulated so as to remove deep UV light from emission of light sources. It is, however, very difficult to remove deep UV light completely from emission of conventional light sources, and hence it has been impossible in conventional exposure apparatuses to reduce the ratio of deep UV light down to 3% or less in exposure light. Since deep UV light thus contained in emission from extreme UV light sources causes impairment of resist patterns in view of roughness and pattern shape, it has been desired to improve this problem.

Meanwhile, the exposure to extreme UV light is generally carried out under high vacuum conditions. Accordingly, when a resist layer is subjected to the exposure in a lithographic process, it often gives off gases of volatile substances, which are low molecular weight compounds formed by photochemical reactions and/or components of the resist composition contained in the resist layer, such as, photosensitive materials and photo acid-generating agents. Those gases are referred to as "outgases", and they often stain photo-masks and/or optical elements such as mirrors in exposure apparatuses to degrade the exposure accuracy. Accordingly, it has been also desired to prevent the resist layer from releasing gases.

As a means for solving the above problems, a method is developed in which the top surface of a resist layer is coated with a topcoat layer which transmits extreme UV light but absorbs deep UV light and also which prevents the resist layer from giving off gases (Patent documents 1 and 2). Further, researches have been made on polymers that absorb deep UV light enough to be usable for the topcoat layer (Patent document 3). Those polymers have benzene, naphthalene or anthracene skeletons so as to improve the effect of the topcoat layer on absorbing deep UV light. For the purpose of further enhancing the absorption of deep UV light, studies have been made on searching suitable polymers and/or favorable combinations of polymers.

PRIOR ART DOCUMENTS

[Patent document 1] Japanese Patent Laid-Open No. 2004-348133
[Patent document 2] U.S. Patent Publication No. 2012/21555
[Patent document 3] International Patent Publication No. 2012/053302

DISCLOSURE OF INVENTION

Problem to be Solved by the Invention

However, it is often impossible to remove deep UV light sufficiently only by selecting known polymers. Accordingly, it has been desired to provide a composition capable of forming a topcoat layer having high effect of absorbing deep UV light.

Means for Solving Problem

The present invention resides in a composition for forming a topcoat layer, comprising a solvent and a fullerene derivative having a hydrophilic group.

The present invention also resides in a pattern formation method comprising the steps of:
casting a resist composition on a substrate, to form a resist layer,
coating the resist layer with the above composition for forming a topcoat layer,
heating to harden the composition on the resist layer,
subjecting the resist layer to exposure by use of extreme UV light, and
developing the exposed resist layer with an alkali aqueous solution.

Effect of the Invention

The present invention enables to form a topcoat layer which can reduce unfavorable effects of deep UV light to protect a resist pattern from impairment in roughness and in pattern shape and also which can prevent a resist layer from releasing gases in a photolithographic process for pattern formation including exposure to extreme UV light. Further, the pattern formation method of the present invention makes it possible to produce a minute pattern accurately without staining the exposure apparatus with gases given off from the resist layer. Furthermore, the composition of the present invention for forming a topcoat layer reduces residues remaining after development on the surface of a resist pattern and hence, also in view of that, can contribute to formation of an excellent pattern.

BEST MODE FOR CARRYING OUT THE INVENTION

Embodiments of the present invention are described below in detail.

The composition according to the present invention is used for forming a topcoat layer on the top surface of a resist layer. This composition comprises a fullerene derivative, and can form a topcoat layer absorbing light (hereinafter, often referred to as "deep UV light") in the wavelength range of 170 to 300 nm, mainly at 193 nm and 248 nm.

A fullerene molecule is well-known to comprise a carbon cluster matrix. There are some known definitions thereof, but the present invention adopts IUPAC Recommendations 2002, in which it means a cage-like molecule having 20 or more carbon atoms all of which are three-coordinated. The most famous fullerene skeleton comprises 60 carbon atoms, but in addition to that there are various skeletons. For example, fullerene skeletons having 70, 76, 78, 82, 84, 90, 94 and 96 carbon atoms are also preferably used in the present invention. Further, the fullerene derivative usable in the present invention is not restricted to a compound whose molecule has a complete fullerene skeleton. This means that the fullerene derivative in the present invention includes a compound whose molecule cannot be regarded as "fullerene molecule" in the strict sense, such as, a compound whose molecule has a partly cleaved fullerene skeleton.

A fullerene compound consisting of only carbon atoms and hydrogen atoms without any substituent groups is very insoluble in alkali solutions. Accordingly, if containing it, the composition for forming a topcoat layer is difficult to be dissolved and removed away from the resist surface in the developing procedure. Further, that fullerene compound has low polarity and poor affinity to the resist surface, and furthermore molecules thereof scarcely interact with each other. Accordingly, it is difficult to form a coat covering the resist surface. The present invention solves this problem by use of a fullerene derivative.

Specifically, the present invention employs a fullerene derivative derived from a fullerene compound by introducing a substituent group, and thereby improves the solubility to an alkali solution so that the composition can be easily removed away in the developing procedure and further so that the affinity to the surface and the interaction among the molecules can be enhanced. Thus, the present invention has succeeded in improving film-formability and coverability of the topcoat layer.

The substituent group is preferably a hydrophilic group. Preferred examples of the hydrophilic group include hydroxyl group, carboxyl group, sulfo group, nitro group, cyano group, and polyalkyleneoxide group. Here, the hydroxyl group includes phenolic hydroxyl group. The above substituent group improves hydrophilicity of the fullerene derivative, and accordingly improves both of the solubility to alkali solutions and the film-formability. It is necessary in general for the derivative to have three or more substituent groups in one fullerene skeleton. However, the more substituent groups the fullerene derivative has, the more the effect of the present invention tends to appear. It is, therefore, preferred for the derivative to have five or more substituent groups in one fullerene skeleton so as to ensure sufficiently solubility to an alkali developer. Further, in view of the film-formability for forming the topcoat layer, the derivative has further preferably eight or more, most preferably ten or more substituent groups in one fullerene skeleton. Various kinds of that fullerene derivative are known. For example, a variety of the derivatives are commercially available from Frontier Carbon Corporation under the name of Nanom Spectra [trademark].

The hydrophilic group does not need to connect directly to the fullerene skeleton, and may connect to the skeleton via a linking group such as a hydrocarbon group. In that case, for example, the linking group may be the main chain of a polymer while the fullerene skeleton may connect to the side chain thereof.

The content of the fullerene derivative in the composition for forming a topcoat layer is controlled according to the optical and gas-barrier characteristics required of the aimed topcoat layer, but is preferably 0.01 to 10 wt %, more preferably 0.5 to 5 wt %, based on the total weight of the composition. It should be noted that the fullerene derivative in the present invention functions as a film-forming component by itself rather than as an additive used in combination with a film-forming polymer for the topcoat layer. Accordingly, in the composition for forming a topcoat layer, all the solid contents may be attributed to the fullerene derivative.

The composition of the present invention for forming a topcoat layer contains a solvent, which can dissolve the above fullerene derivative and, if necessary, polymers and additives. Examples of the solvent include:
(a) mono-alcohols, such as, methyl alcohol, ethyl alcohol, isopropyl alcohol, and methyl isobutyl carbinol;
(b) polyols, such as, ethylene glycol and glycerol;
(c) alkyl ethers of polyols, such as, ethylene glycol monomethyl ether and ethylene glycol monoethyl ether;
(d) alkyl ether acetates of polyols, such as, ethylene glycol monomethyl ether acetate and ethylene glycol monoethyl ether acetate;
(e) ethers, such as, diethyl ether and dibutyl ether;
(f) cyclic ethers, such as, tetrahydrofuran;
(g) hydrocarbons having 12 or less carbon atoms, such as, n-hexane, n-octane, and cyclohexane;
(h) aromatic hydrocarbons, such as, benzene and toluene;
(i) ketones, such as, acetone and methyl ethyl ketone;

(j) esters, such as, methyl acetate, ethyl acetate, and ethyl lactate; and (k) water.

In the present invention, the composition for forming a topcoat layer may contain only the fullerene derivative and the solvent, but may further comprise a polymer as a film-forming component. Since the fullerene derivative has a hydrophilic group, the composition of the present invention for forming a topcoat layer is characterized by being capable of forming a film even if not containing a polymer as a film-forming component. If the composition containing no polymer is used to form a topcoat layer, the formed topcoat layer can be easily removed by a developer. That composition is, hence, preferred. Thus, even if not containing a polymer used generally as a film-forming component, the composition can form a topcoat layer. That is presumed to be because the substituent group introduced into the fullerene derivative is chemically adsorbed onto the resist surface and also because molecules of the fullerene derivative interact and combine with each other.

If a polymer is incorporated as a film-forming component into the composition, the film-formability is improved to form a more even topcoat layer. Thus, if containing the polymer, the composition can form a relatively strong topcoat layer and hence can prevent the topcoat layer from exfoliation caused by physical contact or the like. Accordingly, it is preferred to use the polymer.

If used in combination with the fullerene derivative, the polymer preferably has high compatibility with the derivative. However, the polymer is not particularly restricted, and any polymer can be used. Although the polymer may be a natural polymer compound, a synthetic co-polymer or homo-polymer comprising repeating units is preferably used in view of the production stability. There are no particular restrictions. on the polymerization mode, and in other words, there is no particular restriction on how monomers are polymerized. The polymer may be formed by any polymerization reaction such as condensation polymerization, ring-opening polymerization or addition polymerization.

Various kinds of the polymer are known, and any of them can be selected unless it impairs the effect of the present invention. Examples of the polymer include: phenolic resins such as novolac resin, polyhydroxystyrene, polyvinyl alcohol, polyacrylic acid, polymethacrylic acid, polyacrylic esters, polymethcrylic esters, plyvinyl acetate, and polyvinylpyrrolidone. Examples of the polyacrylic esters and polymethcrylic esters include: hydroxyethyl acrylate, acrylic acid polyethylene oxide adduct, hydroxyethyl methacrylate, and methacrylic acid polyethylene oxide adduct.

The polymer preferably comprises a hydrophilic group having effect of making the polymer soluble in water. That kind of hydrophilic group is generally well-known, and examples thereof include hydroxyl group, carboxyl group, sulfa group, substituted or unsubstituted amino group, substituted or unsubstituted ammonium group, carboxylic ester group, sulfonic ester group, substituted or unsubstituted amino group, alkyleneoxide group, and oxime group. Among them, hydroxyl group and carboxyl group are preferred. In the case where the above groups have substituent groups, examples of the substituent groups include aliphatic hydrocarbon groups such as alkyl groups and aromatic hydrocarbon groups such as phenyl groups. If the substituent groups are aromatic hydrocarbon groups, they often serve as deep-UV absorbing groups. The topcoat layer according to the present invention is preferably used in a pattern formation process in which development is carried out with an alkali aqueous solution, but is not limited to that. For example, if using a fullerene derivative having a less amount of hydrophilic groups, the present invention can be applied to a pattern formation process including development with an organic solvent.

In the case where the composition contains the polymer, the content thereof is controlled according to the aimed thickness or the like but is generally 0.1 to 10 wt %, preferably 0.5 to 5 wt %, based on the total weight of the composition for forming a topcoat layer. If the composition contains the polymer too much, the resultant topcoat layer may be so thick as to absorb a large amount of extreme UV light. That should be paid attention to.

If used in the present invention, the polymer may have deep-UV absorbing groups so as to make up for the fullerene derivative in absorbing deep UV light. Here, the term "deep-UV absorbing groups" in the present invention means groups that absorb light in the wavelength range of 170 to 300 nm. Examples thereof include aromatic groups, particularly, phenyl, naphthyl and anthracenyl. Those groups may have substituent groups, if needed. Examples of the substituent groups include hydrocarbon groups such as alkyl groups.

The composition according to the present invention for forming a topcoat layer may further contain other additives, which are intended, for example, for enhancing coatability of the composition onto the resist layer and for improving characteristics of the formed topcoat layer. The additives are, for example, surfactants. Examples of the surfactants include:

(a) anionic surfactants, such as, alkyl diphenyl ether disulfonic acid, alkyl diphenyl ether sulfonic acid, alkyl benzene disulfonic acid, polyoxyethylene alkyl ether sulfonic acid, alkyl sulfonic acid, and ammonium salts and organic amine salts thereof;

(b) cationic surfactants, such as, hexadecyl trimethyl ammonium hydroxide;

(c) nonionic surfactants, such as, polyoxyethylene alkyl ethers (e.g., polyoxyethylene lauryl ether, polyoxyethylene oleyl ether, polyoxyethylene cetyl ether), polyoxyethylene fatty acid diester, polyoxyethylene, fatty acid monoester, polyoxyethylene-polyoxypropylene block copolymer, and acetylene glycol derivatives; and (d) amphoteric surfactants, such as, 2-alkyl-N-carboxymethyl-N-hydroxyethyl imidazolinium betaine, and lauric acid amide propyl hydroxyl sulfone betaine.

However, it should be noted that those examples by no means constitute an exhaustive list of surfactants usable in the present invention. Among the above, nonionic surfactants are preferred. On the other hand, since surfactants having amine groups or carboxyl groups may react with the hydrophilic group connecting to the fullerene derivative, they should be paid attention to if used. Other additives are, for example, thickening agents, colorants such as dyes, acids and bases. The amount of each additive is determined in consideration of the effect thereof, but is normally 0.01 to 1 wt %, preferably 0.1 to 0.5 wt % based on the total weight of the composition.

The composition according to the present invention for forming a topcoat layer can be used in the same manner as a conventional composition for forming a topcoat layer or for forming a top antireflective coating. This means that it is unnecessary to change the production process drastically when patterns are formed by use of the composition of the present invention. The following describes concretely the pattern formation method employing the composition of the present invention for forming a topcoat layer.

First, a resist composition is cast on the surface, which may be pretreated, if necessary, of a substrate such as a silicon substrate or a glass substrate according to a known coating method such as spin-coating method, to form a resist composition layer. Prior to the coating of the resist composition, an undercoating layer may be beforehand formed under the resist composition layer by coating. The undercoating layer can improve adhesion between the resist layer and the substrate. Further, if containing transition metals or oxides thereof, the undercoating layer can enhance reflected light to improve the exposure margin.

The pattern formation method of the present invention can employ any one selected from known resist compositions sensitive to extreme UV light. At present, it is general to use a resist composition for deep UV exposure, such as, a photoresist composition for ArF or KrF laser exposure. In the pattern formation method according to the present invention, any resist composition can be selected to use without limitation as long as it has sensitivity to extreme UV light. However, particularly preferred are positive- and negative-working chemically amplified resist compositions.

Either positive- or negative-working chemically amplified resist composition can be used in the pattern formation method of the present invention. The chemically amplified resist composition generates an acid when exposed to radiation, and the acid serves as a catalyst to promote chemical reaction by which solubility to a developer is changed within the areas irradiated with the radiation to form a pattern. For example, the chemically amplified resist composition comprises an acid-generating compound, which generates an acid when exposed to radiation, and an acid-sensitive functional group-containing resin, which decomposes in the presence of acid to form an alkali-soluble group such as phenolic hydroxyl or carboxyl group. The composition may comprise an alkali-soluble resin, a crosslinking agent and an acid-generating compound.

Subsequently, according to, for example, spin-coating, the resist layer thus formed on the substrate is coated with the composition of the present invention for forming a topcoat layer. The applied composition is then heated to evaporate the solvent and thereby to form a topcoat layer. This heating is carried out by means of, for example, a hot-plate. The temperature of heating is determined according to the solvent of the composition, but is normally 25 to 150° C., preferably 80 to 130° C., further preferably 90 to 110° C. The topcoat layer thus formed has a thickness of normally 1 to 100 nm, preferably 5 to 50 nm.

The resist layer may be heated alone to harden immediately after formed on the substrate, and then the composition for forming a topcoat layer can be cast thereon and heated.

The topcoat layer thus formed is highly transparent to extreme UV light. In general, transparency to extreme UV light hardly depends on the substituent groups of the polymer, but relatively largely depends on the kinds of elements constituting the polymer. Carbon and hydrogen, which are main constituting elements of the topcoat layer, absorb extreme UV light to such a small degree that the polymer can be transparent enough to achieve the effect of the present invention. The topcoat layer has transmittance of preferably 80% or more, further preferably 85% or more to extreme UV light at 13.5 nm. On the other hand, the topcoat layer formed in the above manner is poorly transparent to deep UV light, and hence has transmittance of preferably 20% or less, further preferably 15% or less to deep UV light at 248 nm.

Thereafter, the resist layer is subjected to exposure through a mask according to necessity by use of extreme UV light, for example, in the wavelength range of 5 to 20 nm, particularly, at 13.5 nm.

After the exposure, the resist layer is subjected to post-exposure heating, if necessary, and then developed in the manner of, for example, paddle development, to form a resist pattern. The development is normally carried out by use of an alkali developer. Since the composition of the present invention for forming a topcoat layer contains the fullerene derivative and water-soluble polymer both of which have hydrophilic groups, the topcoat layer is easily removed by the developer.

The above means that, in the present invention, both removal of the topcoat layer and development of the resist layer can be conducted with an alkali developer at the same time without exceptional procedures. However, the topcoat layer may be alone removed with an aqueous solvent such as water, and then the resist layer can be independently developed with an alkali developer.

Examples of the alkali developer include aqueous solutions of sodium hydroxide and tetramethylammonium hydroxide (TMAH). After the development, the resist pattern is rinsed (washed), if necessary, with a rinse solution, preferably, pure water. The resist pattern thus formed is employed as a resist for etching, plating, ion diffusion or dyeing, and then, if necessary, removed.

The thickness of the resist pattern is suitably determined according to the use and the like, but is normally 0.1 to 150 nm, preferably 20 to 80 nm.

The resist pattern thus formed by the pattern formation method of the present invention is then processed according to the use. The pattern formation method of the present invention does not particularly restrict the process, and hence the resist pattern can be processed in a conventional manner.

If the fullerene derivative is added into the resist composition, deep-UV light may be absorbed to some degree. However, in that case, the fullerene derivative is left in the resultant resist layer. Consequently, when the pattern is formed, the fullerene derivative remains on the top and side surfaces of the resist pattern. As generally known, fullerene derivatives are hard substances and they are harder than the hardened resist layer. Accordingly, the remaining fullerene derivative often forms convex bumps on the top and side surfaces of the resist pattern, and further the bumps may come off to form defects in the shape of craters on the surfaces. It is unfavorable for the resist pattern surface to have those convex bumps and/or concave defects. In contrast, the fullerene derivative in the present invention is not contained in the resist layer and removed in the developing procedure, and hence they do not cause problems.

The present invention is further explained by use of the following Examples.

Examples 101 to 109

As the fullerene derivatives, the following F1 to F5 were prepared.

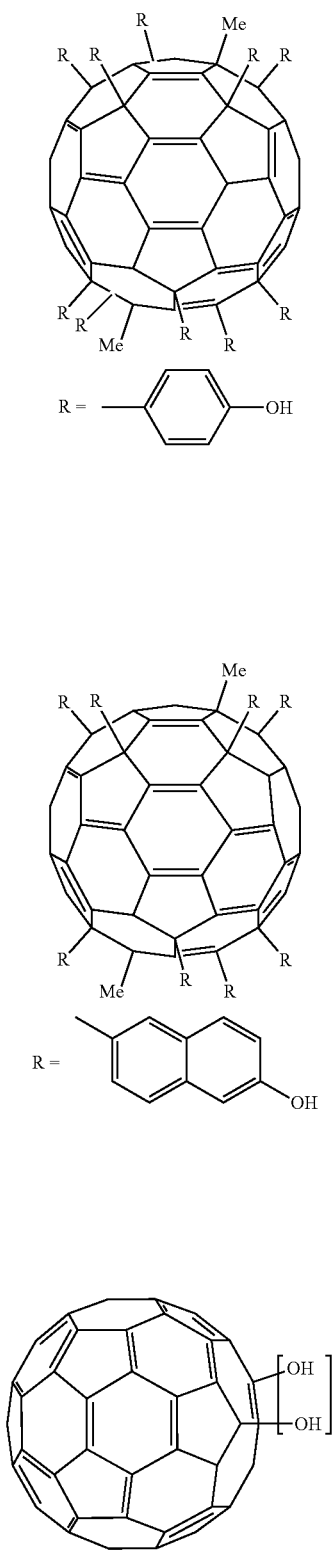

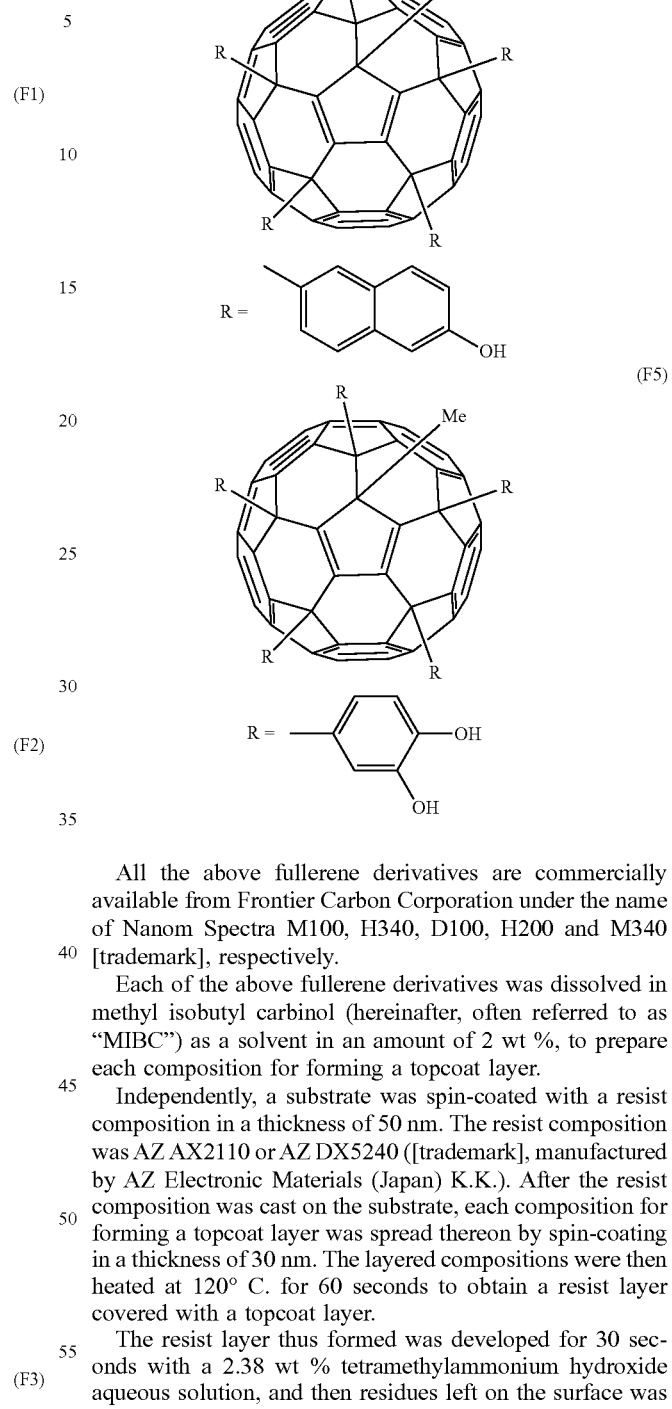

All the above fullerene derivatives are commercially available from Frontier Carbon Corporation under the name of Nanom Spectra M100, H340, D100, H200 and M340 [trademark], respectively.

Each of the above fullerene derivatives was dissolved in methyl isobutyl carbinol (hereinafter, often referred to as "MIBC") as a solvent in an amount of 2 wt %, to prepare each composition for forming a topcoat layer.

Independently, a substrate was spin-coated with a resist composition in a thickness of 50 nm. The resist composition was AZ AX2110 or AZ DX5240 ([trademark], manufactured by AZ Electronic Materials (Japan) K.K.). After the resist composition was cast on the substrate, each composition for forming a topcoat layer was spread thereon by spin-coating in a thickness of 30 nm. The layered compositions were then heated at 120° C. for 60 seconds to obtain a resist layer covered with a topcoat layer.

The resist layer thus formed was developed for 30 seconds with a 2.38 wt % tetramethylammonium hydroxide aqueous solution, and then residues left on the surface was evaluated. The results were shown in Table 1.

TABLE 1

| Examples | Contents of fullerene derivatives (%) | | | | | Residues on surface |
| --- | --- | --- | --- | --- | --- | --- |
|  | F1 | F2 | F3 | F4 | F5 |  |
| Ex. 101 | 100 |  |  |  |  | not observed |
| Ex. 102 |  | 100 |  |  |  | not observed |
| Ex. 103 |  |  | 100 |  |  | not observed |

TABLE 1-continued

| Examples | Contents of fullerene derivatives (%) | | | | | Residues on surface |
|---|---|---|---|---|---|---|
| | F1 | F2 | F3 | F4 | F5 | |
| Ex. 104 | | | | 100 | | not observed |
| Ex. 105 | | | | | 100 | not observed |
| Ex. 106 | 50 | 50 | | | | not observed |
| Ex. 107 | 50 | | 50 | | | not observed |
| Ex. 108 | | 50 | | 50 | | not observed |
| Ex. 109 | | | 50 | | 50 | not observed |

Comparative Example 201 and Examples 201 to 210

The procedure of Example 1 was repeated to obtain a resist layer. The obtained resist layer was subjected to exposure by use of a BL03 beam from Spring-8 at the illuminance of 0.35 mW/cm², and then developed for 30 seconds with a 2.38% aqueous solution of tetramethylammonium hydroxide. In that way, the exposure amount necessary for forming a pattern, namely, the energy threshold $E_{th}$ was measured. This procedure was repeated except for changing the fullerene derivative contained in the composition for forming a topcoat layer. The results were shown in Table 2. The polymers used here were as follows:

P1: novolac resin (weight average molecular weight: 8,500),

P2: polyhydroxystyrene (weight average molecular weight: 12,000),

P3: polyvinyl alcohol (weight average molecular weight: 22,000), and

P4: polyacrylic acid (weight average molecular weight: 11,000).

TABLE 2

| Examples | Contents of fullerene derivatives (%) | | | | | Energy threshold $E_{th}$ (mJ/cm²) |
|---|---|---|---|---|---|---|
| | F1 | F2 | F3 | F4 | F5 | |
| Com. 201 | without topcoat layer | | | | | 5 |
| Ex. 201 | 100 | | | | | 6 |
| Ex. 202 | | 100 | | | | 7 |
| Ex. 203 | | | 100 | | | 7 |
| Ex. 204 | | | | 100 | | 8 |
| Ex. 205 | | | | | 100 | 6 |
| Ex. 206 | 50 | 50 | | | | 8 |
| Ex. 207 | 50 | | 50 | | | 7 |
| Ex. 208 | 50 | | | 50 | | 8 |
| Ex. 209 | 50 | | | | 50 | 7 |
| Ex. 210 | | 50 | | 50 | | 7 |

Comparative Example 301 and Examples 301 to 311

The procedure of Example 101 was repeated to form a pattern. In the procedure, the pressure in the exposure chamber was measured before and after exposure to extreme UV light, to obtain the pressure difference ΔP between them. This procedure was repeated except for changing the fullerene derivative contained in the composition for forming a topcoat layer. The results were shown in Table 3.

TABLE 3

| Examples | Contents of components (%) | | | | | | | | | ΔP (×10⁻⁷ Pa) |
|---|---|---|---|---|---|---|---|---|---|---|
| | F1 | F2 | F3 | F4 | F5 | P1 | P2 | P3 | P4 | |
| Com. 301 | without topcoat layer | | | | | | | | | 17.0 |
| Ex. 301 | 100 | | | | | | | | | 6.10 |
| Ex. 302 | | 100 | | | | | | | | 6.20 |
| Ex. 303 | | | 100 | | | | | | | 5.45 |
| Ex. 304 | | | | 100 | | | | | | 5.07 |
| Ex. 305 | | | | | 100 | | | | | 5.28 |
| Ex. 306 | 50 | 50 | | | | | | | | 6.50 |
| Ex. 307 | 50 | | 50 | | | | | | | 6.21 |
| Ex. 308 | 50 | | | 50 | | | | | | 6.01 |
| Ex. 309 | 50 | | | | 50 | | | | | 5.40 |
| Ex. 310 | | 50 | | 50 | | | | | | 6.30 |
| Ex. 311 | | | 50 | | 50 | | | | | 6.50 |
| Ex. 312 | 50 | | | | | 50 | | | | 6.00 |
| Ex. 313 | 50 | | | | | | 50 | | | 5.32 |
| Ex. 314 | 50 | | | | | | | 50 | | 4.68 |
| Ex. 315 | 50 | | | | | | | | 50 | 5.27 |
| Ex. 316 | 80 | | | | | | | 20 | | 5.01 |
| Ex. 317 | 90 | | | | | | | 10 | | 5.28 |

Comparative Examples 401 to 404 and Examples 401 to 407

The composition for forming a topcoat layer was cast by spin-coating to form a layer of 30 nm thickness, and then the light-transmittance of the layer was evaluated. Specifically, the absorption coefficient was estimated by analysis with a spectroscopic ellipsometer, to calculate k values at the wavelengths of 193 nm and 248 nm. As the results shown in Table 4, it was found that the layers of Comparative examples 401 to 404, in which the fullerene derivatives were not used, so hardly absorbed deep UV light that their k values at 248 nm were 0 or very small while those of Examples 401 to 407 largely absorbed deep UV light.

TABLE 4

| Examples | Contents of components (%) | | | | | k value | |
|---|---|---|---|---|---|---|---|
| | F1 | P1 | P2 | P3 | P4 | 193 nm | 248 nm |
| Com. 401 | | 100 | | | | 0.86 | 0.03 |
| Com. 402 | | | 100 | | | 1.00 | 0.01 |
| Com. 403 | | | | 100 | | 0.00 | 0.00 |
| Com. 404 | | | | | 100 | 0.00 | 0.00 |
| Ex. 401 | 100 | | | | | 0.86 | 0.38 |
| Ex. 402 | 50 | 50 | | | | 0.86 | 0.22 |
| Ex. 403 | 50 | | 50 | | | 0.93 | 0.19 |
| Ex. 404 | 50 | | | 50 | | 0.56 | 0.17 |
| Ex. 405 | 50 | | | | 50 | 0.48 | 0.12 |
| Ex. 406 | 80 | 20 | | | | 0.69 | 0.30 |
| Ex. 407 | 90 | 10 | | | | 0.76 | 0.31 |

Comparative Examples 501 to 505 and Examples 501 to 514

The substrate was spin-coated with a resist composition in a thickness of 40 nm. The resist composition was SEVR-337 ([trademark], manufactured by Shin-Etsu Chemical Co., Ltd.). After the resist composition was cast on the substrate, each composition for forming a topcoat layer was spread thereon by spin-coating in a thickness of 30 nm. The layered compositions were then heated at 95° C. for 60 seconds to obtain a resist layer covered with a topcoat layer.

The obtained resist layer was subjected to imagewise exposure by use of Spring-8 storage ring New SUBARU, and then developed for 30 seconds with a 2.38% aqueous solution of tetramethylammonium hydroxide. In that way, the energy threshold and the critical dimension CD of the obtained pattern were measured. Further, with respect to the pattern of each example, the dimension change LCD was calculated on the basis of the pattern dimension of Comparative example 501. The results were shown in Table 5.

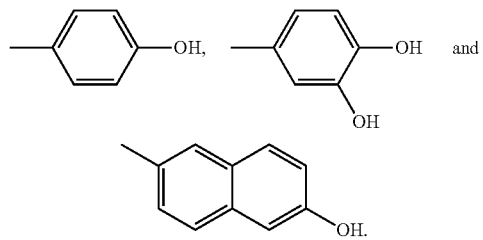

TABLE 5

| Examples | Contents of fullerene derivatives (%) | | | | | Contents of polymers (%) | | | | Energy threshold $E_{th}$ (mJ/cm$^2$) | CD (nm) | ΔCD (nm) |
|---|---|---|---|---|---|---|---|---|---|---|---|---|
| | F1 | F2 | F3 | F4 | F5 | P1 | P2 | P3 | P4 | | | |
| Com. 501 | | | | without topcoat layer | | | | | | 15.8 | 22.78 | — |
| Ex. 501 | 100 | | | | | | | | | 16.9 | 22.27 | −0.51 |
| Ex. 502 | | 100 | | | | | | | | 16.7 | 22.15 | −0.63 |
| Ex. 503 | | | 100 | | | | | | | 17.0 | 22.31 | −0.47 |
| Ex. 504 | | | | 100 | | | | | | 16.5 | 22.20 | −0.58 |
| Ex. 505 | | | | | 100 | | | | | 16.8 | 22.08 | −0.70 |
| Ex. 506 | 50 | | | | | 50 | | | | 18.6 | 20.43 | −2.35 |
| Ex. 507 | 50 | | | | | | 50 | | | 18.9 | 20.71 | −2.07 |
| Ex. 508 | 50 | | | | | | | 50 | | 18.2 | 21.20 | −1.58 |
| Ex. 509 | 50 | | | | | | | | 50 | 14.8 | 19.53 | −2.25 |
| Ex. 510 | | 50 | | | | 50 | | | | 18.0 | 20.66 | −2.12 |
| Ex. 511 | | | 50 | | | 50 | | | | 18.3 | 20.47 | −2.31 |
| Ex. 512 | | | | 25 | 25 | 50 | | | | 18.1 | 20.74 | −2.04 |
| Ex. 513 | 80 | | | | | 20 | | | | 17.3 | 21.57 | −1.21 |
| Ex. 514 | 90 | | | | | 10 | | | | 16.1 | 22.20 | −0.58 |
| Com. 502 | | | | | | 100 | | | | 19.2 | 19.10 | −3.68 |
| Com. 503 | | | | | | | 100 | | | 19.6 | 18.77 | −4.01 |
| Com. 504 | | | | | | | | 100 | | 24.5 | 19.56 | −3.22 |
| Com. 505 | | | | | | | | | 100 | 15.0 | 18.21 | −4.57 |

The obtained results obviously indicate that the energy threshold $E_{th}$ was improved when the topcoat layer was formed from only the polymers without the fullerene derivatives. Further, it is also obvious that, although the critical dimension was changed by forming the topcoat layer, the layers formed from only the polymers showed large dimension changes as compared with the case where the topcoat layer was not provided (Comparative example 501) while the layers containing the fullerene derivatives showed small dimension changes and, in particular, those formed from only the fullerene derivatives showed remarkably small dimension changes. Meanwhile, in order to evaluate the coatability, eye observation was made about the in-plane evenness of layer thickness after coating. As a result, it was found that, although the coatability tended to be improved according as the polymer content increased, even the compositions not containing the polymers had practically usable coatability. Further, in all the examples, no residues were found on the layer after development.

The invention claimed is:

1. A composition for forming a topcoat layer, comprising of a solvent, a polymer, a fullerene derivative having a phenolic hydroxyl group, wherein the phenolic hydroxyl group is selected from the group consisting of 2. The composition for forming a topcoat layer according to claim 1, wherein said fullerene derivative comprises a main chain having 60, 70, 76, 78, 82, 84, 90, 94 or 96 carbon atoms.

3. The composition for forming a topcoat layer according to of claim 1, wherein the content of said fullerene derivative is 0.01 to 10 wt % based on the total weight of the composition.

4. The composition for forming a topcoat layer according to claim 1, wherein said polymer has a deep-UV absorbing group.

5. The composition for forming a topcoat layer according to claim 4, wherein the content of said polymer is 0.01 to 10 wt % based on the total weight of the composition.

6. The composition for forming a topcoat layer according to claim 1, wherein the content of said polymer is 0.01 to 10 wt % based on the total weight of the composition.

7. The composition for forming a topcoat layer according to claim 1, wherein said fullerene derivative comprises has 3 or more hydrophilic groups.

8. The composition for forming a topcoat layer according to claim 1, wherein said fullerene derivative comprises has 3 or more hydrophilic groups.

9. The composition according to claim 1 wherein the polymer comprises a hydrophilic group having effect of making the polymer soluble in water selected from the group consisting of hydroxyl group, carboxyl group, sulfo group, substituted amino, unsubstituted amino group, substituted ammonium, unsubstituted ammonium group, carboxylic ester group, sulfonic ester group, substituted amido group, unsubstituted amido group, alkyleneoxide group, and oxime group.

10. The composition according to claim 1 wherein the solvent is an aqueous solvent.

11. The composition according to claim 1 wherein the solvent is comprised of a solvent selected from the group consisting of monoalcohols, polyols and alkyl ethers of polyols.

12. A pattern formation method comprising the steps of:
   casting a resist composition on a substrate, to form a resist layer,
   coating the resist layer with a composition for forming a topcoat layer wherein said composition for forming a topcoat layer comprises a solvent, a polymer, a fullerene derivative having a phenolic hydroxyl group, wherein the phenolic hydroxyl group is selected from the group consisting of

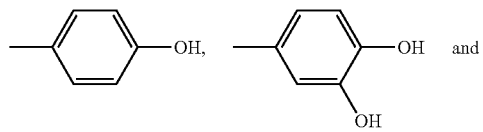

-continued

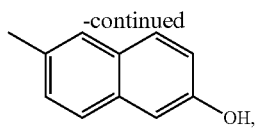

heating to harden the composition on the resist layer,
subjecting the resist layer to exposure by use of extreme UV light, and
developing the exposed resist layer with an alkali aqueous solution.

13. The pattern formation method according to claim 12, wherein said extreme UV light has a wavelength in the range of 5 to 20 nm.

14. The pattern formation method according to claim 12, wherein the formed topcoat has a thickness of 1 to 100 nm.

15. The pattern formation method according to claim 12, wherein the heating step is carried out at a temperature of 25 to 150° C.

* * * * *